United States Patent [19]

Bouvrette

[11] Patent Number: 4,626,622

[45] Date of Patent: Dec. 2, 1986

[54] TELEPHASING METHOD AND SYSTEM FOR REMOTELY IDENTIFYING UNKNOWN PHASES OF TRANSMISSION OR DISTRIBUTION LINES WITHIN AN ELECTRICAL NETWORK

[75] Inventor: Michel Bouvrette, Ste-Sophié, Canada

[73] Assignee: Hydro-Quebec, Montreal, Canada

[21] Appl. No.: 814,300

[22] Filed: Dec. 30, 1985

Related U.S. Application Data

[63] Continuation of Ser. No. 607,404, May 7, 1984, abandoned.

[30] Foreign Application Priority Data

Nov. 15, 1983 [CA] Canada .................................. 441171

[51] Int. Cl.[4] .......................................... H04M 11/00
[52] U.S. Cl. ....................................... 379/99; 324/66; 324/83 R; 279/106
[58] Field of Search .................. 179/2 A, 2 AM, 2 C, 179/2 DP, 175.3 A; 340/658; 324/66, 83 R, 83 A, 86, 107, 108

[56] References Cited

U.S. PATENT DOCUMENTS

| | | | |
|---|---|---|---|
| 2,676,208 | 4/1954 | Hampe et al. ...................... | 179/2 A |
| 3,027,513 | 3/1962 | Mulavey . | |
| 3,156,868 | 11/1964 | Murrils ................................ | 324/108 |
| 3,555,417 | 1/1971 | Mitchell, Sr. ........................ | 324/86 |
| 3,764,904 | 10/1973 | Drexler ................................ | 324/86 |
| 4,020,287 | 4/1977 | Wilkerson ........................... | 179/2 A |
| 4,241,237 | 12/1980 | Paraskevakos et al. ......... | 179/2 AM |

FOREIGN PATENT DOCUMENTS

| | | |
|---|---|---|
| 1054225 | 5/1979 | Canada . |
| 1056309 | 6/1979 | Canada . |
| 2035598 | 2/1971 | Fed. Rep. of Germany . |
| 2348500 | 11/1977 | France . |
| 1482717 | 10/1974 | United Kingdom . |
| 2083932 | 8/1981 | United Kingdom . |

Primary Examiner—James L. Dwyer
Attorney, Agent, or Firm—Schwartz, Jeffery, Schwaab, Mack, Blumenthal & Evans

[57] ABSTRACT

The telephasing method and system identify an unknown phase within a polyphase network by comparison of the unknown phase with a known reference phase of the polyphase network. The system is especially designed for carrying out the identification of the unknown phase when the reference phase is located at a point of the polyphase network far from the point where the unknown phase is located. The system comprises a first device connected to the reference phase and a second device connected to the unknown phase. The first and second devices each comprise a modem for establishing a telephone connection between the two devices. The first device includes circuitry to produce a digital signal representative of the alternating voltage of the reference phase. This representative signal is transmitted through the two modems and the telephone connection from the first to the second device. The second device comprises circuitry to produce a digital signal representative of the alternating voltage of the unknown phase. The second device is provided with circuits for compensating the transmission delay of the digital signal representative of the alternating voltage of the reference phase transmitted through the telephone connection from the first to the second device. The second device also includes a phase detection circuit for identifying the unknown phase by detecting the phase angle between the alternating voltage of the reference phase and the alternating voltage of the unknown phase.

44 Claims, 4 Drawing Figures

FIG. 2

FIG. 3
REFERENCE UNIT

FIG. 4
VERIFICATION UNIT

TELEPHASING METHOD AND SYSTEM FOR REMOTELY IDENTIFYING UNKNOWN PHASES OF TRANSMISSION OR DISTRIBUTION LINES WITHIN AN ELECTRICAL NETWORK

This application is a continuation of application Ser. No. 607,404, filed May 7, 1984, now abandoned.

BACKGROUND OF THE INVENTION

The present invention relates to a telephasing system and method for identifying an unknown phase within a polyphase network used for transmission or distribution of electrical energy, for example, a three-phase network, by comparison of the unknown phase with a known phase of the polyphase network. The system according to the present invention is especially designed for use when the known phase is located at a point of the network far from the point of the network where the unkown phase is located.

It should be noted that in the present disclosure and in the appended claims, the expressions "telephasing" and "phasing" relate to the determination or identification of unknown phases within a polyphase network.

The telephasing method and system according to the present invention allow the identification of unknown phases. For example, in the case of the addition of a line or the modification of the path or run of a line within a three-phase network. The system and method of the present invention allow the identification of unknown phases within the three-phase network when these unkown phases are located far from known phases of this same network. Such a method and system can also advantageously allow the staff responsible for the distribution of electricity to the consumers to identify the phases of the rural or urban distribution lines.

Up to now, the identification of such unknown phases in a three-phase network for transmission or distribution of electrical energy was made by carrying out one of the following methods, the choice of which was dependent on the specific variables of each given application. Some of these methods consist of an injection on one phase of a low voltage through a distribution transformer, an injection on one phase of a high frequency signal, a single phase closing of breakers or other disconnecting devices mounted on the three-phase network, or a use of phasing sticks, of a reference voltage of the electrical distribution network, or of voltage transformers.

Some of the above-mentioned different methods should be carried out with no voltage on the network, whereby the electricity consumers supplied through this network are deprived of electricity during relatively long periods (from one to a few hours). Moreover, in most of the cases, these methods involve risks for the staff and the equipment, and require a large staff.

There is known from Canadian Pat. No. 1,056,309 (White) granted on June 12, 1979, a communication system using one of the lines of transmission of electrical energy of a three-phase network. However, the object of such a system is not to identify the unknown phases of a three-phase network, but to establish a communication interconnection between many points of this three-phase network through one of its electrical energy transmission lines. It is evident that the different phases, at the interconnecting point of this communication system with the three-phase network, must be known in order to allow the establishment of the desired interconnection between these different points.

Other devices for determining the sequence of the phases in a three-phase system are described in Canadian Pat. No. 1,054,225 (Vandevier et al), and U.S. Pat Nos. 3,156,868 (Murrills), 3,555,417 (Mitchell) and 3,764,904 (Drexler). However, such devices do not allow the identification of the phases of a three-phase system when all the three phases of this system are unknown.

SUMMARY OF THE INVENTION

An object of the present invention is therefore to provide a telephasing system and method which, as already mentioned, allow an identification of an unknown phase within a polyphase network used for transmission or distribution of electrical energy, by comparison of this unknown phase with a known phase located at a point of the network far from the point of this network where the unknown phase is located.

Another object of the present invention is to provide a telephasing system and method which can be used to identify an unknown phase within a polyphase network when this network is under voltage, and which considerably reduce the risks for the staff and the equipment.

A further object of the present invention is to provide a telephasing system and method in which the elecricity consumers supplied through the network will not be affected.

More particularly, according to the present invention, there is provided a telephasing system for identifying an unknown phase within a polyphase network used for transmission or distribution of electrical energy. The system compares this unknown phase with a known, reference phase of the polyphase network. The reference phase and the unknown phase operate at alternating voltages of the same frequency. The reference phase is located at a point of the polyphase network far from the point of the polyphase network where the unknown phase is located.

This telephasing system comprises a first device connected to the reference phase and a second device connected to the unknown phase. The first and second devices comprise means for establishing a communication interconnection between the first and second devices. One of the first and second devices comprises a transmitting device and means for producing a first signal representative of the alternating voltage of the phase connected to the transmitting device. The means for establishing the communication interconnection comprises means for transmitting the first representative signal from the transmitting device to the other of the first and second devices through the communication interconnection. The other device comprises means for producing a second signal representative of the alternating voltage of the phase connected to the other device, and means for identifying, from the first representative signal received from the transmitting device and from the second representative signal, the unknown phase by a detection of a phase angle between the alternating voltage of the unknown phase and the alternating voltage of the reference phase.

The telephasing system according to the invention also comprises means for compensating for a transmission delay of the first representative signal transmitted through the communication interconnection from the transmitting device to the other device, in order to prevent any error introduced by this transmission delay in the detection of the phase angle.

The present invention also relates to a telephasing method for identifying an unknown phase within a polyphase network used for transmission or distribution of electrical energy. The method includes comparison of this unknown phase with a known, reference phase of the polyphase network. The reference phase and the unknown phase operate at alternating voltages of the same frequency. The reference phase is located at a point of the polyphase network far from the point of the polyphase network where the unknown phase is located.

The telephasing method comprises the steps of establishing a communication interconnection between a first device connected to the reference phase and a second device connected to the unknown phase and producing, by means of one of said first and second devices constituting a transmitting device, a first signal representative of the alternating voltage of the phase connected to the transmitting device. The method also includes transmitting to the other of the first and second devices the first representative signal through the communication interconnection and producing, by means of the other device, a second signal representative of the alternating voltage of the phase connected to this other device. Further, the method includes identifying, by means of the other device and from the first representative signal received by this other device from the transmitting device and the second representative signal, the unknown phase by a detection of a phase angle between the alternating voltage of the unknown phase and the alternating voltage of the reference phase.

The telephasing method also comprises a step of compensating for a transmission delay of the first representative signal transmitted through the communication interconnection from the transmitting device to the other device, in order to prevent any error introduced by this transmission delay in the detection of the phase angle.

Preferably, the communication interconnection is a telephone connection and the means for establishing this telephone connection may comprise, for example, a modem associated with each of the first and second devices.

BRIEF DESCRIPTION OF THE DRAWINGS

The objects, advantages and other features of the present invention will become more apparent from the following description of a preferred embodiment thereof, given for the purpose of illustration only, with reference to the accompanying drawings in which like reference numerals represent like parts throughout and in which.

DETAILED DESCRIPTION OF THE PREFERRED EMBODIMENTS

Figure 1:
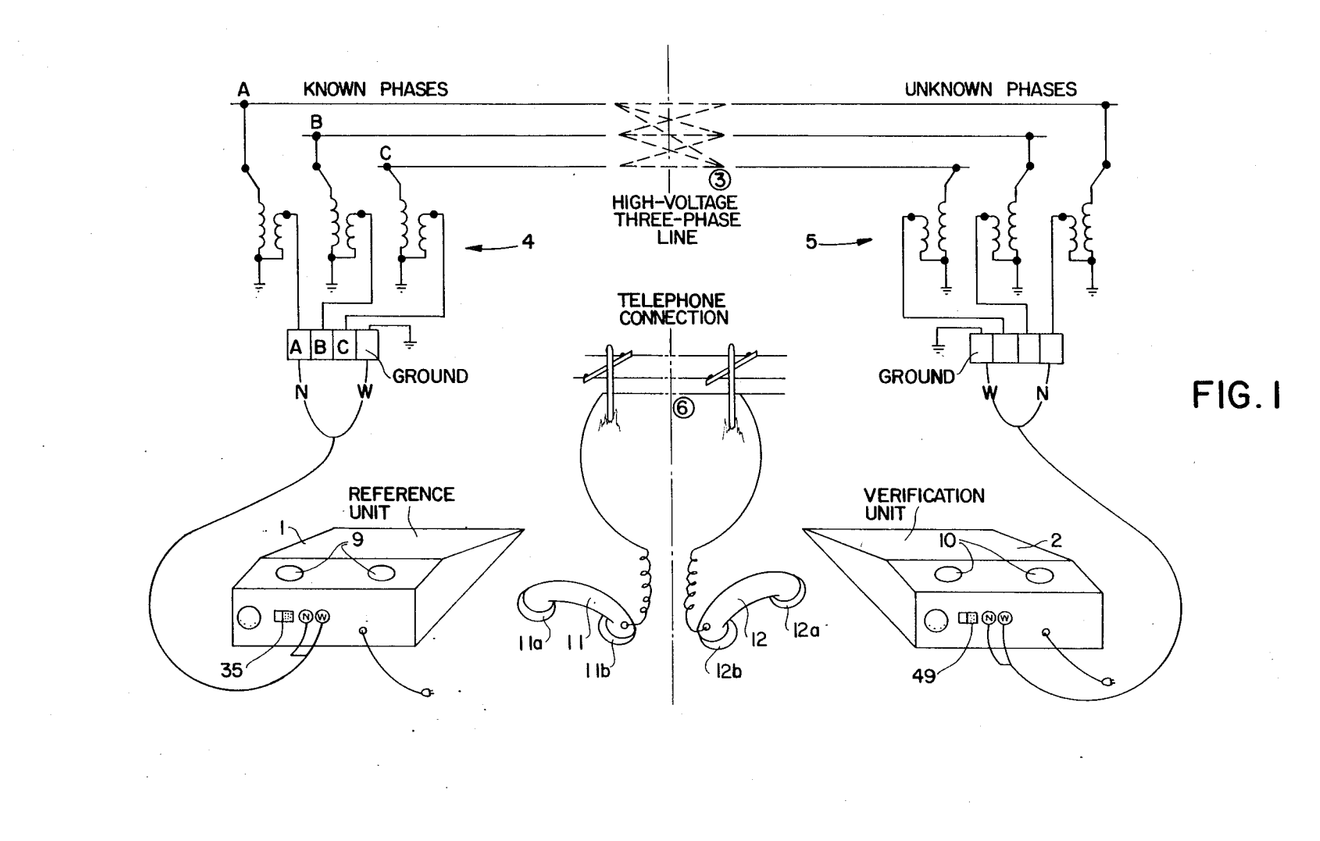
FIG. 1 schematically illustrates an embodiment of a telephasing system according to the present invention, as well as the interconnection of this system with the unknown phase and the reference phase.
Figure 2:
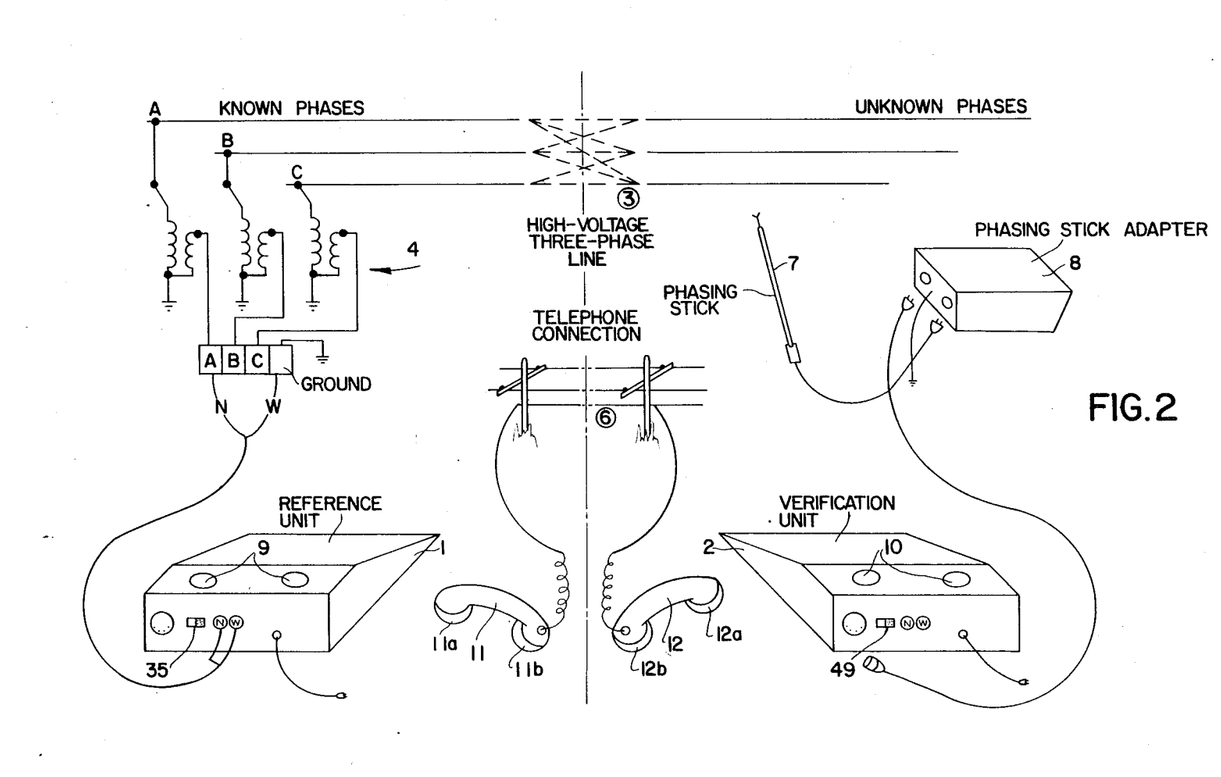
FIG. 2 schematically illustrates a second embodiment of a telephasing system according to the present invention, as well as the interconnection of the system with the unknown phase and reference phase.

As illustrated in FIGS. 1 and 2, the telephasing system comprises a reference unit 1 and a verification unit 2. These two units 1 and 2 can be interconnected through a telephone connection schematically shown at 6. This telephone connection is established by means of two telephone sets illustrated schematically by the handsets 11 and 12 having earphones 11a and 12a and microphones 11b and 12b which cooperate with acoustical couplers 9 and 10 incorporated in modems forming part of the units 1 and 2, as will be explained hereinafter.

This type of interconnection through acoustical couplers, of course, makes the telephasing system sensitive to the surrounding sounds or noises. To overcome this problem, each acoustical coupler can be mounted in an acoustically insulated box or case provided with access means for the handset of the corresponding telephone set.

In the case where there are no telephone sets at the points where the reference and verification units are located, it would be possible to provide service vehicles with portable telephone sets. Such portable telephone sets are easily available on the market. This would also facilitate the identification of the phases of rural or urban lines of a distribution network of a company distributing electricity to subscribers.

As illustrated in FIGS. 1 and 2, the reference unit 1 and verification unit 2 are connected to a high voltage three-phase network used for transmission or distribution of electrical energy. The phases A, B and C of the high voltage three-phase line 3 of this network operate at a nominal frequency of, for example, 60 Hz. The reference unit 1 is located at a point where the phases A, B and C are known, and the verification unit 2 is located at a point where the phases of the three-phase line 3 are unknown, but where it is desired to identify these phases.

Of course, the reference and verification units can be connected to a different phase of the three-phase lines of the above-mentioned three-phase network. One should, of course, take into consideration any phase shift produced by power transformers provided on the network.

The reference unit 1 is connected to a known phase on the line 3. For example, reference unit 1 may be connected to the Phase A (referred to hereinafter as the reference phase) through a voltage transformer 4. Transformer 4 is made available or is especially provided for reducing the level of the high voltage of this reference phase to a suitable level for the purpose of the reference unit 1.

A signal having a nominal frequency (for example 60 Hz) corresponding to the voltage of the reference phase is produced by the reference unit from the reduced high voltage. This signal is transmitted by the reference unit 1 to the verification unit 2 through the telephone connection 6, as will become more apparent upon reading of the following description.

As illustrated in FIG. 1, the verification unit 2 is connected to an unknown phase of the line 3 through a voltage transformer 5. Transformer 5 is made available or is especially provided for reducing the level of the high voltage of the unknown phase to a suitable level for the purpose of the verification unit 2. Verification unit 2 is especially designed to compare a signal having a nominal frequency corresponding to the alternating voltage of this unknown phase with the signal having a nominal frequency corresponding to the alternating voltage of the reference phase received from the reference unit 1. In this manner, verification unit 2 determines if the alternating voltages of the unknown phase and of the reference phase are in phase or not, as will be described with reference to FIGS. 3 and 4.

FIG. 1 shows that the reference phase and the unknown phase are each picked up directly on a high voltage line through a voltage reducing transformer having its primary winding connected to this high voltage line. However, each of the reference and unknown phases could also be picked up on the secondary winding of an operating voltage reducing power transformer through a voltage reducing transformer 4 or 5. Again, in this latter case, one should take into consideration the phase shift produced by the power transformer, if this transformer produces such a phase shift.

Another alternative for picking up the voltage of the reference phase or of the unknown phase is to use a phasing stick. This alternative can be used when the voltage level is sufficiently low, i.e., up to a voltage of about 120 kV, and when transformers for reducing the level of the high voltage to a sufficiently low level are not available. This alternative is shown in FIG. 2 of the drawings where the voltage of the unknown phase is detected through a phasing stick 7 connected directly to the high voltage of this unknown phase. Such phasing sticks are well known in the art and are available on the market. For that reason, the structure of these phasing sticks will not be further described.

The voltage at the output of the phasing stick 7, which corresponds to the voltage of the phase to which the phasing stick is connected, is transmitted to the verification unit 2 through a phasing stick adapter 8. As the voltage from the phasing stick is on the order of magnitude of one volt, this voltage is amplified by the phasing stick adapter 8. This phasing stick adapter also comprises a shaping circuit for converting the voltage at the output of the phasing stick to a digital signal having the same frequency as this output voltage, i.e., having the same nominal frequency as the voltage of the phase to which the phasing stick 7 is connected.

The phasing stick adapter 8 further comprises a circuit to correct for a phase shift present between the input voltage and the output voltage of the phasing stick 7. As this phase shift is a function of the number of phasing sticks used, the phasing stick adapter 8 also comprises a switch positioned according to the number of phasing sticks used in order to correct appropriately the phase shift produced. It should be noted that the use of a phasing stick facilitates the telephasing operations in the distribution network of a company distributing electricity to its subscribers.

The circuit of the reference unit 1 and of the verification unit 2 will now be described in detail with reference to FIGS. 3 and 4.

Figure 3:
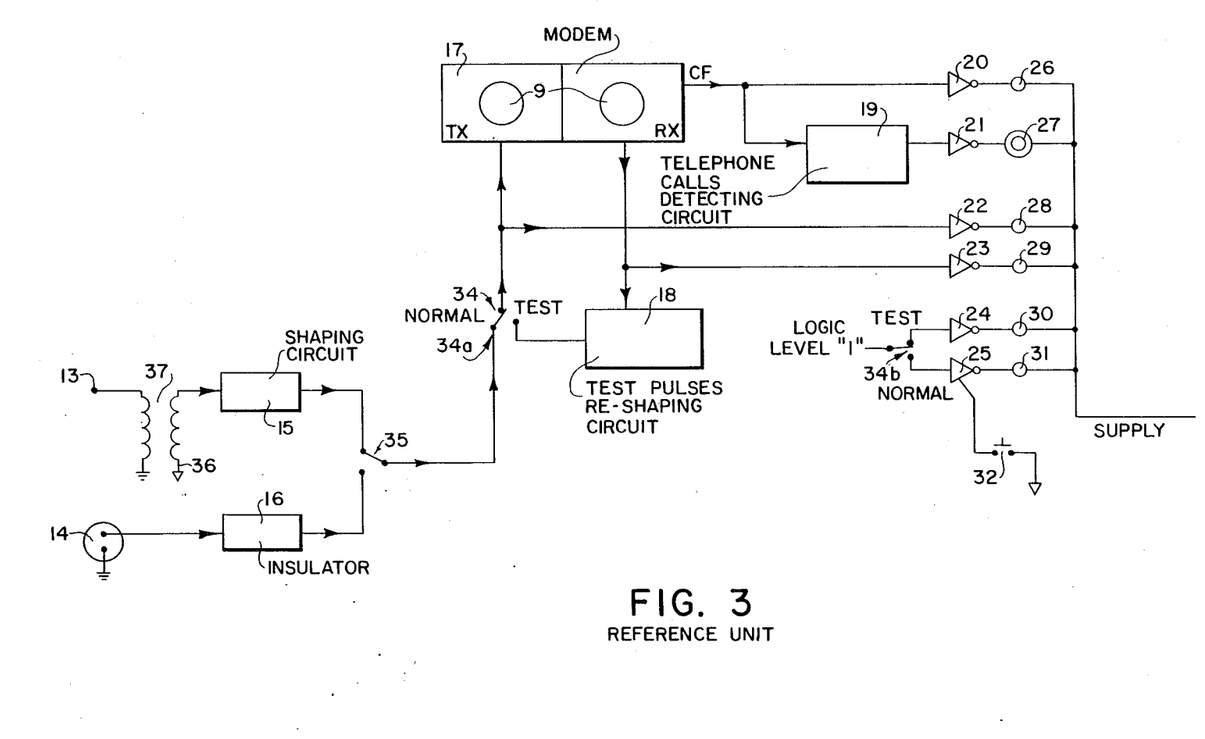
FIG. 3 is a block diagram of the circuit of a reference unit forming part of the telephasing system of FIGS. 1 and 2.

The reference unit 1 (FIGS. 1 and 2) comprises, as shown in FIG. 3, two inputs 13 and 14. Input 13 is provided for receiving the voltage of the reference phase when this voltage is supplied by a voltage reducing transformer, for example, transformer 4 of FIGS. 1 and 2, through the interconnection N of FIGS. 1 and 2. Input 14 is provided for receiving the voltage of the reference phase when this voltage is supplied through a phasing stick and a phasing stick adapter, as described hereinabove in connection with FIG. 2.

The input 13 is connected to a terminal of the primary winding of a voltage reducing transformer 37. This primary winding has its other terminal connected to ground through the interconnection W of the reference unit of FIGS. 1 and 2. The secondary winding of the transformer 37 has a terminal connected to the ground of the DC power supply of the reference unit 1, illustrated schematically at 36. This secondary winding transmits the reduced voltage of the reference phase to a shaping circuit 15. Shaping circuit 15 converts the sinusoidal signal present across the secondary winding of the transformer 37 into a digital signal having the same frequency as the nominal frequency sinusoidal signal from the transformer 37.

The input 14, which can be connected to the output of a phasing stick adapter as described above, is electrically isolated from the remainder of the circuit of the reference unit by an isolator 16, which can be, for example, an optical isolator.

A switch 35, also illustrated schematically in FIGS. 1 and 2, permits selection between the output of the circuit 15, when the voltage of the reference phase is supplied through a voltage reducing transformer, for example, transformer 4 of FIGS. 1 and 2, or the output of the isolator 16, when the voltage of the reference phase is supplied through a phasing stick and a phasing stick adapter.

The nominal frequency digital signal at the output of the shaping circuit 15 or at the output of the isolator 16 (depending on the position of switch 35) is transmitted through the contact 34a of a switch 34 when this switch is in its "NORMAL" position. The signal from switch 34 is provided to the transmission side TX of a modem 17 to be subsequently modulated and transmitted to the verification unit 2 through the telephone connection 6 of FIGS. 1 and 2 and through the corresponding acoustical coupler 9 of the modem 17, as described hereinabove.

The reference unit advantageously comprises a series of lamps or light emitting diodes (LED) for displaying its operation.

As shown in FIG. 3, a lamp or LED illustrated schematically at 26, is lighted when a signal CF is generated by the modem 17. Signal CF indicates that this modem is receiving a carrier signal having a good level and frequency when the two telephone handsets 11 and 12 are connected with the corresponding acoustical couplers 9 and 10 of the reference and verification units. Signal CF controls the lighting of the lamp or LED 26 through an inverter 20. When the handset 12 of the above-mentioned telephone set is disconnected from the acoustical couplers 10 of the verification unit 2 of FIGS. 1 and 2, the modem 17 stops receiving the carrier signal and the signal CF indicates this condition to a circuit 19. Circuit 19 is operative to detect telephone calls and to activate a buzzer 27 through an inverter 21 to indicate receipt of a telephone call, i.e., to indicate that the operator of the verification unit 2 wants to communicate with the operator of the reference unit 1.

Consequently, as the verification unit 2 is provided with a similar circuit for detecting telephone calls, and with a corresponding buzzer, when the operator of one of the two units 1 and 2 wants to communicate with the operator of the other unit, this operator has only to disconnect the corresponding telephone handset from the associated acoustical couplers of the corresponding unit. The operator of the other unit is then advised of this call through the buzzer of the corresponding unit, as at this moment, the unit stops receiving the carrier signal from the unit having its acoustical couplers disconnected from the telephone handset, and energizes its buzzer.

Two other lamps or LEDs shown schematically at 28 and 29 and two associated inverters 22 and 23 are also provided. LED 28 indicates if a signal is transmitted to the transmission side TX of the modem 17. Transmission side TX comprises the acoustical coupler 9 connected with the microphone 11b of the handset 11. LED 29 indicates if a signal is received by the receiving side RX of this modem 17. Receiving side RX comprises the acoustical coupler 9 connected to the earphone 11a of the handset 11 of FIGS. 1 and 2.

Two lamps or LEDs shown schematically at 30 and 31 and two associated inverters 24 and 25 are mounted as shown in FIG. 3 in order to indicate the position "NORMAL" position or "TEST" position of the switch 34 through the contacts 34b of switch 34.

A push-button 32 is connected to control inputs of the inverters 20 to 25 to allow a verification of the opera-tion of the lamps or LEDs 26 and 28 to 31 and of the buzzer 27 simultaneously. The connection of the push-button 32 with the control inputs of the inverters 20 to 25 has been illustrated only in connection with the in-verter 25 for the purpose of simplification.

When the switch 34 is in the "TEST" position, a signal, preferably a test pulse, is transmitted by the verification unit. The purpose of the test pulse is to measure the average communication delay through the telephone connection between the two units. The test pulse is received by the receiving side RX of the modem 17, reshaped through a circuit 18 and retransmitted to the verification unit by the transmission side TX of the modem 17.

Figure 4:
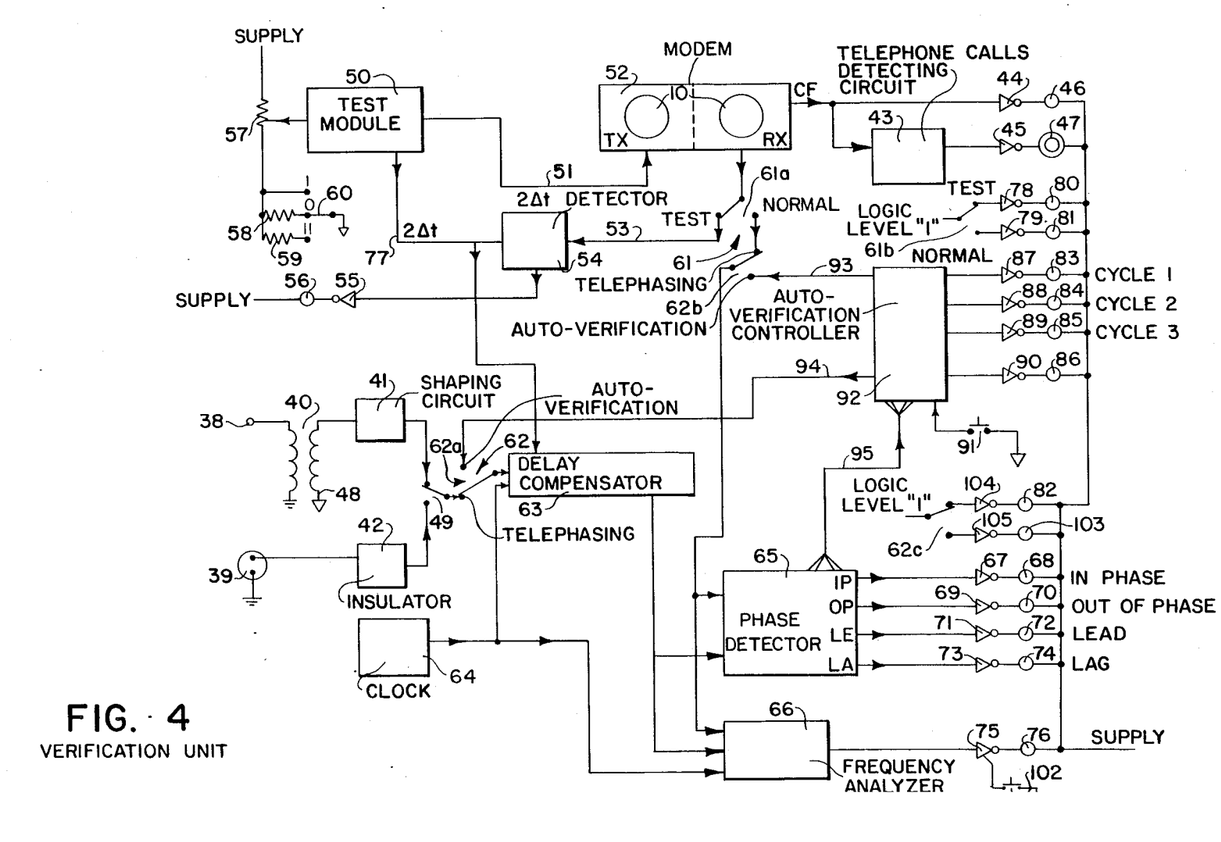
FIG. 4 is a block diagram of the circuit of a verification unit also forming part of the telephasing system of FIGS. 1 and 2.

As illustrated in FIG. 4 of the drawings, the verification unit 2 of FIGS. 1 and 2 comprises an input 38 associated with a voltage reducing transformer 40. Transformer 40 is connected to a shaping circuit 41 for receiving the voltage of the unknown phase through, for example, the interconnection N of the reference unit 2 of FIG. 1 when this voltage is supplied through voltage reducing transformer 5 of FIG. 1. The transformer 40 has its primary winding connected to ground through the interconnection W of the verification unit 2 of FIG. 1 and its secondary winding connected to the ground of the DC power supply of the verification unit illustrated schematically at 48. The shaping circuit 41 has a structure similar to the structure of the circuit 15 of the reference unit shown in FIG. 3. The verification unit also comprises another input 39 which can be connected to the phasing stick adapter 8 of FIG. 2 to receive the nominal frequency digital signal (corresponding to the unknown phase) delivered by this adapter when a phasing stick is used. This input 39 is isolated from the remainder of the circuit of the verification unit through an isolator 42 which can be of the same type as the isolator 16 of the reference unit illustrated in FIG. 3.

A switch 49, also shown schematically in FIGS. 1 and 2, allows a selection of the output of the circuit 41 or of the output of the isolator 42 depending on whether the voltage of the unknown phase is supplied through transformer 5, as shown in FIG. 1, or through the phasing stick 7 and its associated phasing stick adapter 8, as shown in FIG. 2.

When the verification unit carries out a telephasing operation, the nominal frequency digital signal at the output of the circuit 41, or of the isolator 42, is transmitted through the switch 49 to an input of a delay compensator 63 through the contacts 62a of a switch 62, switch 62 having been placed in a "TELEPHASING" position. This delay compensator 63 retards (as will become more apparent from the following description) the nominal frequency digital signal (representative of the unknown phase) received through switch 49 for a period of time corresponding to an average value of the transmission delay through the telephone connection. Thus, the average delay of the nominal frequency digital signal representative of the voltage of the reference phase transmitted by the reference unit is compensated for by compensator 63. The above compensation is carried out in accordance with a 2·Δt signal supplied to an input of the compensator 63 by a test module 50 and from a digital clock signal at a frequency of 100 kHz generated by a clock circuit 64. The nature of the 2·Δt signal and the operation of the compensator 63 will be defined in more detail hereinafter.

As illustrated in FIG. 4, when a telephasing operation is carried out, the nominal frequency digital signal representative of the voltage of the reference phase is received through the receiving side RX of a modem 52. The receiving side RX comprises the acoustical coupler 10 connected to the earphone 12a of the handset 12. From modem 52, the digital signal is supplied to an input of a phase detector 65 through contacts 61a of the switch 61 in the "NORMAL" position and contacts 62b of the switch 62 in the "TELEPHASING" position.

Each cycle of the nominal frequency digital signal at the output of the delay compensator 63 is compared in the detector 65 with a cycle of the nominal frequency digital signal received by the receiving side RX of the modem 52. The phase detector 65 comprises a masking circuit provided for compensating any random phase shift of the nominal frequency digital signal representative of the voltage of the reference phase occurring during its transmission through the telephone connection. This phase shift influences the transmission delay of the nominal frequency digital signal transmitted through the telephone connection in a random manner as will appear more clearly upon reading of the following description.

The result of the phase comparison in the detector 65 of the two nominal frequency digital signals representative, respectively, of the voltage of the reference phase and of the voltage of the unknown phase, is indicated through outputs IP, OP, LE and LA of the phase detector 65.

When the two compared signals are considered in phase by the detector 65, the output IP commands the lighting of a lamp or LED schematically illustrated at 68 through an inverter 67. When the two compared signals are considered out of phase with respect to each other, a lamp or LED shown schematically at 70 is lighted by the output OP of the detector 65 through the inverter 69.

In the same manner, the lamps or LEDs shown schematically at 72 and 74 are lighted by the outputs LE and LA of the detector 65 through inverters 71 and 73, respectively. LEDs 72 and 74 indicate, respectively, whether the phase of the signal representative of the unknown phase is considered advanced or retarded with respect to the phase of the signal representative of the voltage of the reference phase for whose transmission delay through the telephone connection has been previously compensated.

The reduced voltages of the reference phase and of the unknown phase are converted in the same manner into nominal frequency digital signals through phasing stick adapters or through shaping circuits 15 and 41 of the verification and reference units of FIGS. 3 and 4. This conversion takes into consideration the positive and negative alternating values of the voltages of the reference and unknown phases. The determination of the phase through the detector 65 of FIG. 4 can therefore be carried out based on the complete cycle of the voltage wave.

In this way, when the signals compared through the phase detector 65 are out of phase with respect to each other by 180° (inverted relative to each other), the lamp or LED 70 is lighted indicating that the two compared signals are out of phase. Thus, the phase detector avoids any ambiguity in the phase detection. Since the determination of the phase is carried out based on the complete cycle, it is possible, as already mentioned, to determine if the phase of the nominal frequency digital signal representative of the unknown phase is leading or lagging with respect to the nominal frequency digital signal representative of the reference phase. Therefore, no misinterpretation is possible.

As described above, only one reference phase is compared with only one unknown phase at the same time, in order to avoid any confusion.

The nominal frequency digital signal representative of the voltage of the reference phase received from the modem 52 and the digital signal representative of the voltage of the unknown phase from the compensator 63, as well as the signal produced by the clock 64, are applied to a frequency analyzer 66. Frequency analyzer 66 energizes a lamp or LED 76 through an inverter 75 when the frequency of the digital signals representative of the reference phase and of the unknown phase is located, for example, between 55 and 65 Hz for a nominal frequency of 60 Hz, in order to prevent any risk of comparison of digital signals having a frequency other than the network frequency.

As the nominal frequency digital signals representative of the alternating voltage of the reference phase and of the alternating voltage of the unknown phase are compared in time, and the telephone connection induces a delay between the transmission and the reception of the nominal frequency signal representative of the voltage of the reference phase, it is important, as already mentioned, to compensate for this delay to thereby avoid any error in the detection of the phase angle between the voltage of the reference phase and the voltage of the unknown phase and therefore to determine exactly the nature of the unknown phase. The method used for compensating for this delay or retardation will be explained in detail hereinbelow.

An average value of the transmission delay of the nominal frequency signal representative of the voltage of the reference phase from the reference unit to the verification unit through the telephone connection 6 of FIGS. 1 and 2 is determined with the switch 61 of FIG. 4 and the switch 34 of FIG. 3 in the "TEST" position. The test module 50 automatically and cyclically generates a series of test pulses. The test pulses are passed through an interconnection 51 to the transmission side TX of the modem 52, which comprises the acoustical coupler 10 connected to the microphone 12b of the handset 12. Each test pulse is received, reshaped and retransmitted by the reference unit as described above with reference to FIG. 3. Each test pulse retransmitted by the reference unit is received by the receiving side RX of the modem 52 and supplied through an interconnection 53 and the contacts 61a of the switch 61 in the "TEST" position to a detector 54. Detector 54 detects the time 2·Δt required by a test pulse to travel to the verification unit 1 and return to the reference unit 2, i.e. two times the distance between the verification unit and the reference unit.

The test module 50 includes a monostable circuit which generates 2·Δt pulses having a width representative of the transmission delay required for each test pulse to travel to the reference unit 1 and back. The test pulses are supplied through an interconnection 77 to the detector 54. It should be noted that each 2·Δt pulse is produced by the test module simultaneously with the generation of a test pulse. A potentiometer 57, having a fine adjustment through a plurality of turns, is provided for adjusting the width of the 2·Δt pulses at the output of the test module 50. Of course, the time between two test pulses generated through the test module 50 must be longer than the time necessary for each test pulse to travel to the verification unit and back through the telephone connection 6 of FIGS. 1 and 2. The detector 54 energizes a lamp or LED shown schematically at 56 through an inverting circuit 55 when the trailing edges of the 2·Δt pulses correspond on the average to the reception of the test pulses, i.e., when the width of the 2·Δt pulses correspond on the average to the transmission delay of each test pulse to the reference unit 1 and back. The lighting of lamp or LED 56 therefore indicates that the average value of the transmission delay of the nominal frequency digital signal representative of the alternating voltage of the reference phase from the reference unit 1 to the verification unit 2 is compensated for by the adjustment of the potentiometer 57. The transmission delay varies as indicated hereinabove with the phase shift of the transmitted digital signal during transmission. If the average transmission delay is not appropriately compensated for through the adjustment of the potentiometer 57, the lamp or LED 56 flashes. Of course, the adjustment of the potentiometer 57 corresponds to a value of the transmission delay for the test pulses to travel to the reference unit 1 and back. This delay is an average value of the round trip transmission delay measured during the adjustment operation of the potentiometer.

The 2·Δt pulses are transmitted from the test module to the delay compensator 63. When the switch 61 returns to its "NORMAL" position, compensator 63 detects a value equal to half of the width of the 2·Δt pulses, i.e., the average delay due to the transmission from the reference unit to the verification unit. This half width value is determined by means of a counter circuit and the digital signal from the clock 64. The compensator 63 then memorizes this value and uses it for compensating the average transmission delay, by delaying the nominal frequency digital signal representative of the unknown phase. The verification unit is then ready for identifying the unknown phase.

The determination of the average transmission delay through the adjustment of the potentiometer 57 must be carried out when a switch 60 is in the "0" position. In order to compensate for an angular phase shift of ±30° produced by power transformers located between the points of the three-phase network where the verification and reference units are located, the switch 60 is positioned in a "1" or "11" position before setting the position of the switch 61 to "NORMAL", i.e., before carrying out a telephasing operation. The switch 60 and the resistors 58 and 59 act on the width of the 2·Δt pulses for allowing compensation of the phase shift produced by these power transformers.

As already mentioned hereinabove, the adjustment of the potentionmeter 57 corresponds to an average value of the transmission delay and the compensator 63 therefore compensates for this average delay. Indeed, the transmission delay varies with any phase shift of the signal representative of the alternating voltage of the reference phase during its transmission on the telephone connection. It is known in communication theory that a plurality of uncontrollable factors can influence the phase shift of signals transmitted through telephone lines or by waves propagated in the air. The phase of these signals therefore varies in a random manner.

As the above-defined phase shift varies randomly, i.e., in a non-foreseeable manner, the masking circuit of the phase detector 65 must have a structure allowing the compensation of such a random variation. A possible design for the masking circuit is one which generates a masking pulse of a predetermined width at each leading and trailing edge of the nominal frequency digital signal representative of the voltage of the reference phase received through the receiving side RX of the modem 52 and at each leading and trailing edge of the nominal frequency digital signal representative of the voltage of the unknown phase from the compensator 63. The masking circuit then comprises a logic circuit which receives and analyzes these masking pulses for automatically masking the result of the phase comparison of the two nominal frequency digital signals when these two signals are out of phase by an angle smaller than an angle corresponding to the predetermined width of the masking pulses. This phase angle is produced by the above-mentioned phase shift of the nominal frequency digital signal transmitted through the telephone connection. Masking of the phase comparison is carried out during time periods which extend from the beginning of the first of the two masking pulses generated for the leading and trailing edges of the two nominal frequency digital signals applied to the detector 65 until the end of the second of these two masking pulses.

It should be noted that the predetermined width of the generated masking pulses is selected to cancel any error on the phase comparison due to any phase shift of the transmitted signal which can be produced on the telephone line and that for any distance between the reference and verification units for which the telephasing system can be used.

The use of the above-mentioned masking circuit therefore prevents any error introduced in the phase detection through the detector 65 by the random phase shift. This random phase shift can, of course, be produced in either of two directions (leading or lagging), particularly when the voltages of the reference and unknown phases are in phase. Of course, the predetermined width of the masking pulses is limited to permit detection of a phase angle between the two nominal frequency digital signals representative of the voltages of the reference and unknown phases supplied to the detector 65 when these signals correspond to different phases of the same three-phase network. In other words, when the signals are, in fact, out of phase by an angle of 120°.

The verification unit further comprises an autoverification circuit allowing a cyclic verification of the principal elements of the verification unit.

The autoverification is carried out with the switch 62 in the "AUTOVERIFICATION" position, and with the modem 52 operating in the test mode and in the origin frequency mode. The operation modes of the modem 52 being selected as above, the test pulses supplied by the module 50 are transmitted directly through the air from the acoustical coupler of the transmission side of the modem 52 to the acoustical coupler of the receiving side of modem 52. Of course, for an autoverification operation, the microphone and the earphone of the handset are not connected to the acoustical couplers of the modem 52.

With the switch 61 in the "TEST" position, as mentioned hereinabove, and with the switch 60 in the "0" position, the potentiometer 57 is adjusted so as to light the lamp or LED 56. The switch 61 is thereafter returned to its "NORMAL" position. The push-button 91 is then depressed for starting an autoverification operation through an autoverification controller 92. Controller 92 stores in memory the delay necessary for the test pulses supplied by the module 50 to be transmitted through the air as above defined.

After the switch 61 is returned to its "NORMAL" position and the push-button 91 has been depressed, the controller 92 supplies a nominal frequency digital signal corresponding to the phase A of the three-phase system through an interconnection 93 to the detector 65 and the analyzer 66. The controller 92 also transmits cyclically on a connection 94 three different nominal frequency signals corresponding respectively to the phases A, B and C of the same three-phase system. The cyclic transmission of the phases A, B and C on the connection 94 by the controller 92 corresponds respectively to autoverification cycles 1, 2 and 3. The controller 92 induces a phase angle in the signals corresponding to the phases A, B and C supplied on the interconnection 94 with respect to the signal transmitted through the connection 93. This phase angle corresponds to the above-mentioned delay necessary for the transmission of the test pulses through the air. The delay compensator 63 compensates for the delay previously detected through the adjustment of the potentiometer 57. Delay compensator 63 transmits the signal present on the interconnection 94, after delaying this signal, to the detector 65 and to the analyzer 66. Lamps or LEDs shown schematically at 83 to 85 and the associated inverters 87 to 89 indicate each cycle of the autoverification procedure carried out by the controller 92. The signals supplied to the controller 92 on an interconnection 95 by the phase detector 65 allow this controller to determine if the verification unit is in order or not. If the autoverification indicates that the verification unit is in good order, the lamp or LED shown schematically at 86 is lighted by the controller 92 through the inverter 90.

If the operator wishes to carry out another autoverification operation, he has only to depress the push-button 91 again.

The above described autoverification can therefore easily check the operation of the detector 65, the analyzer 66, the compensator 63, the modem 52, the test module 50 and the detector 54 with only a few operations.

The verification unit also comprises a telephone call detecting circuit 43, inverters 44 and 45, a lamp or LED shown schematically at 46 and a buzzer 47 having the same functions as those explained in detail hereinabove with reference to the telephone call detecting circuit 19, the inverters 20 and 21, the lamp or LED 26 and the buzzer 27 of FIG. 3.

Lamps or LEDs shown schematically at 80 and 81, and associated inverters 78 and 79 are provided for indicating the position of the contacts 61b of the switch 61 for thereby indicating the operation of the verification unit.

The operation of the verification unit is also displayed by the position of the contacts 62c of the switch 62 which energizes a lamp or LED shown schematically at 82 through an inverter 104, or a lamp or LED shown schematically at 103 through the inverter 05.

A push-button 102 connected to control inputs of all the inverters illustrated in FIG. 4 allows a verification of the operation of the lamps or LEDs of the verification unit as well as the buzzer 47. Only the interconnection of this push-button 102 with the inverter 75 is shown in FIG. 4 for the purpose of simplification of the drawings.

Of course, the operation of the modem 17 of the reference unit of FIG. 3 and the operation of the modem 52 of the verification unit of FIG. 4 must be appropriately selected to allow the two modems to carry out all the functions described hereinabove.

The verification unit could eventually comprise a microprocessor designed for carrying out the phase detection, the measurement and compensation of the transmission delay as well as the autoverification performed by this verification unit.

It is evident that the telephasing system of the invention also operates if the unit 1 of FIGS. 1 and 2 is connected to the unknown phase while the unit of FIGS. 1 and 2 to the reference phase, by interchanging only the lamps or LEDs 72 and 74.

It would also be possible to include the two circuits of the reference and verification units in two different units. The identification of the unknown phase would then be carried out at the two points, i.e., at the point of the network where the unknown phase is located and at the point of the network where the reference phase is located. Such units would reduce the risk of error because two different circuits would identify the unknown phase.

The structure of the embodiments of the telephasing system as described in the above disclosure can, of course, be modified at will within the scope of the appended claims, without changing or altering the nature and inventive idea of the present invention.

What is claimed is:

1. A telephasing system for identifying an unknown phase within a polyphase network used for transmission or distribution of electrical energy, by comparison of said unknown phase with a known reference phase, of said polyphase network, the reference phase and the unknown phase operating at alternating voltages of the same frequency, the reference phase being located at a point of said polyphase network far from a point of the polyphase network where the unknown phase is located, said telephasing system comprising:

a first device connected to the reference phase and a second device connected to the unknown phase, said first and second devices each comprising means for establishing a bidirectional communication interconnection between said first and second devices;

one of said first and second devices constituting a transmitting device and comprising means for producing a first signal representative of the alternating voltage of the phase connected to said transmitting device;

said means for establishing said communication interconnection comprising means for transmitting said first representative signal from the transmitting device to the other of said first and second devices through said communication interconnection;

said other device comprising means for producing a second signal representative of the alternating voltage of the phase connected to said other device and means for identifying, from said first representative signal received from said transmitting device and from said second representative signal, the unknown phase by a detection of a phase angle between the alternating voltage of the unknown phase and the alternating voltage of the reference phase;

said telephasing system also comprising:

means for generating at least one short duration test signal and for bringing about a round trip of said test signal between said first and second devices through said bidirectional communication interconnection and the interconnection establishing means;

means for measuring a transmission delay of said round trip of the test signal between the first and second devices, and for determining, from said measured round trip transmission delay, a transmission delay of said first representative signal transmitted through the communication interconnection from the transmitting device to said other device; and means for compensating for said transmission delay of the first representative signal determined by said measuring and determining means, in order to prevent any error introduced by said first representative signal transmission delay in said detection of the phase angle.

2. The system of claim 1, wherein said means for establishing a communication interconnection comprises a modem for each of said first and second devices, said two modems comprising means for establishing a telephone connection between said first and second devices, said telephone connection constituting said communication interconnection.

3. The system of claim 2, wherein said means for establishing a telephone connection comprises, for each modem, means for connecting said modem to a telephone set provided with a microphone and an earphone, said connecting means comprising first and second acoustical couplers and means for acoustically interconnecting the microphone and the earphone of the telephone set with the first and second acoustical couplers, respectively, in order to establish said telephone connection between the first and second devices.

4. The system of claim 3, wherein at least one device out of said first and second devices comprises means for detecting a disconnection between the microphone and the earphone of the telephone set associated with the other device out of said first and second devices, and the first and second acoustical couplers of the modem of said other device out of said first and second devices.

5. The system of claim 4, wherein said means for detecting said disconnection comprises means for detecting a telephone call, the modem of said at least one device out of said first and second devices having means for delivering an output signal indicating receipt or non-receipt of a carrier wave transmitted by the modem of the other device out of said first and second devices, said telephone call detecting means including a circuit receiving said output signal and activating a buzzer device when said output signal indicates that the modem of said at least one device out of said first and second devices does not receive said carrier wave thus indicating that a disconnection interrupts said telephone connection between the first and second devices and thereby the transmission of said carrier wave, for indicating that an operator of the other device out of said first and second devices wants to communicate with an operator of said at least one device out of said first and second devices.

6. The system of claim 1, wherein said signal producing means of said transmitting device comprise means for reducing the amplitude of the alternating voltage of the phase connected to said transmitting device.

7. The system of claim 6, wherein said amplitude reducing means comprises a voltage reducing transformer connected through another voltage reducing transformer to said phase connected to the transmitting device.

8. The system of claim 6, wherein said signal producing means of the transmitting device further comprises means for converting the reduced amplitude alternating voltage into a digital signal constituting said first representative signal and having a frequency equal to the frequency of the alternating voltage of the phase connected to said transmitting device.

9. The system of claim 8, wherein said transmitting device comprises a phasing stick interconnected with the phase connected to said transmitting device, said phasing stick constituting said amplitude reducing means, and a phasing stick adapter receiving the reduced amplitude alternating voltage from the phasing stick and comprising means for compensating for a phase shift produced by said phasing stick and said means for converting said reduced amplitude alternating voltage into a digital signal, said digital signal being delivered on an output of the phasing stick adapter.

10. The system of claim 9, wherein said transmitting device comprises means for isolating said output of the phasing stick adapter from the remainder of the circuit of the transmitting device.

11. The system of claim 1, wherein said signal producing means of said other device comprise means for reducing the amplitude of the alternating voltage of said phase connected to said other device.

12. The system of claim 11, wherein said amplitude reducing means comprise a voltage reducing transformer connected through another voltage reducing transformer to said phase connected to said other device.

13. The system of claim 11, wherein said signal producing means of said other device further comprise means for converting the reduced amplitude alternating voltage into a digital signal constituting said second representative signal and having a frequency equal to the frequency of the alternating voltage of the phase connected to said other device.

14. The system of claim 13, wherein said other device comprises a phasing stick interconnected with said phase connected to said other device, said phasing stick constituting said amplitude reducing means, and a phasing stick adapter receiving said reduced amplitude alternating voltage from said phasing stick and comprising means for compensating for a phase shift produced by said phasing stick and said means for converting said reduced amplitude alternating voltage into a digital signal, said digital signal being delivered on an output of said phasing stick adapter.

15. The system of claim 14, wherein said other device comprises means for isolating said output of the phasing stick adapter from the remainder of the circuit of said other device.

16. The system of claim 1, wherein said signal producing means of said transmitting device comprises means for converting the alternating voltage of the phase connected to said transmitting device into a first periodical digital signal having a frequency equal to the frequency of the alternating voltage of the phase connected to said transmitting device, said first digital signal constituting said first representative signal, and wherein said producing means of said other device comprises means for converting the alternating voltage of said phase connected to said other device into a second periodical digital signal having a frequency equal to the frequency of the alternating voltage of the phase connected to said other device, said second digital signal constituing said second representative signal, said first and second digital signals taking into account, respectively, the positive or negative alternate values of the alternating voltage of the phase connected to said transmitting device, and the positive or negative alternate values of the alternating voltage of the phase connected to said other device.

17. The system of claim 16, wherein said compensating means comprises means for delaying said second digital signal for a time period corresponding to said transmission delay of said first digital signal transmitted by the transmitting device to said other device through said communication interconnection.

18. The system of claim 17, wherein said identifying means of said other device comprises means for detecting a phase angle between the first digital signal and said second delayed digital signal.

19. The system of claim 18, in which said compensating means comprise means for compensating for a phase shift of said first digital signal occurring during the transmission of said first digital signal through said communication interconnection, said compensating means comprising means for masking the result of said phase angle detection carried out by said phase angle detection means when said phase angle between the first digital signal and the second delayed digital signal is less than a predetermined value.

20. The system of claim 19, in which said identification means further comprises a display device controlled by the result of the phase angle detection carried out by said phase angle detection means for indicating if the alternating voltage of the unknown phase is in phase or is out of phase with respect to the alternating voltage of said reference phase, said display device further comprising means, also controlled by the result of the phase angle detection carried out by said phase angle detection means for indicating if the phase of the voltage of the unknown phase is leading or lagging with respect to the phase of the voltage of the reference phase when the voltage of the unknown phase is out of phase with respect to the voltage of the reference phase.

21. The system of claim 1, further comprising means for compensating for a phase shift between the alternating voltage of the reference phase and the alternating voltage of the unknown phase produced by at least one transformer provided on said polyphase network between the point where the reference phase is located and the point where the unknown phase is located.

22. The system of claim 17, in which said other device comprises a frequency analyzer receiving a clock signal, said first digital signal and said second delayed digital signal for measuring the respective frequencies of said two digital signals in order to determine if these frequencies are located within a predetermined frequency bandwidth in order to prevent an identification of the unknown phase with digital signals having an unappropriate frequency.

23. The system of claim 1, wherein said other device comprises auto-verification means for verifying a proper operating of at least a part of the circuit of said other device.

24. The system of claim 1, further comprising means for permitting an operator of said first device and an operator of said second device to communicate therebetween through said communication interconnection.

25. The system of claim 1, in which said compensating means comprise means for compensating for a phase shift of said first representative signal occurring during the transmission of said first representative signal through said communication interconnection, said phase shift influencing said transmission delay of the first representative signal.

26. A telephasing method for identifying an unknown phase within a polyphase network used for transmission or distribution of electrical energy, by comparison of said unknown phase with a known reference phase of said polyphase network, the reference phase and the unknown phase operating at alternating voltages of the same frequency, the reference phase being located at a point of said polyphase network far from the point of the polyphase network where the unknown phase is located, said telephasing method comprising the steps of:

establishing a bidirectional communication interconnection between a first device connected to the reference phase and a second device connected to the unknown phase;

producing, by means of one of the first and second devices constituting a transmitting device, a first signal representative of the alternating voltage of the phase connected to said transmitting device;

transmitting to the other of said first and second devices said first representative signal through said communication interconnection;

producing, by means of said other device, a second signal representative of the alternating voltage of the phase connected to said other device; and identifying, by means of said other device and from said first representative signal received by said other device from said transmitting device and said second representative signal, the unknown phase by a detection of phase angle between the alternating voltage of the unknown phase and the alternating voltage of the reference phase;

said method also comprising the steps of:

generating at least one short duration test signal;

bringing about a round trip of said test signal between said first and second devices through said bidirectional communication interconnection;

measuring a transmission delay of said round trip of the test signal between said first and second devices;

determining, from said measured round trip transmission delay, a transmission delay of said first representative signal transmitted through the bidirectional interconnection from the transmitting device to said other device; and compensating for the transmission delay of the first representative signal, determined by said determining step, in order to prevent any error introduced by said first representative signal transmission delay in said detection of the phase angle.

27. The method of claim 26, in which said communication interconnection is a telephone connection.

28. The method of claim 26, wherein said first and second representative signals are respectively formed by first and second periodical digital signals having a frequency equal to the frequency of said alternating voltages of the reference and unknown phases, and taking into consideration the positive or negative alternate values of said alternating voltages of the reference and unknown phase.

29. The method of claim 26, wherein said compensating step comprises a step in which said second representative signal is delayed for a period of time corresponding to said transmission delay of the first representative signal through said communication interconnection from the transmitting device to said other device.

30. The method of claim 29, wherein said identification step comprises the step of detecting a phase angle between the first representative signal and the second delayed representative signal.

31. The method of claim 30, wherein said compensation step comprises the step of compensating for a phase shift of said first representative signal occurring during the transmission of said first representative signal through said communication interconnection, said phase shift influencing said transmission delay of said first representative signal.

32. The method of claim 31, wherein said step of compensation of said phase shift comprises a step in which the result of said step of detection of a phase angle between the first representative signal and the second delayed representative signal is masked when said phase angle between the first representative signal and the second delayed representative signal is less than a predetermined value.

33. The method of claim 26, wherein said generating bringing about, measuring, and determining steps comprise the steps of:

generating successive test pulses by means of said other device, said test pulses constituting said at least one test signal;

transmitting said test pulses from said other device to said transmitting device through said communication interconnection;

re-shaping said test pulses received by said transmitting device;

transmitting said re-shaped pulses from the transmitting device to said other device through said communication interconnection;

measuring an average value of a round trip transmission delay of said test pulses between the transmitting device and said other device; and determining an average value of said transmission delay of the representative signal from the transmitting device to said other device from said measured average value of said round trip transmission delay.

34. The method of claim 26, wherein said compensating step comprises the step of compensating for a phase shift of the first representative signal occurring during the transmission of said first representative signal through said communication interconnection, said phase shift influencing said transmission delay of the first representative signal.

35. The system of claim 1, wherein said generating and bringing about means comprises means for generating a series of successive test signals having each a short duration and constituting said at least one test signal, and means for bring about successively a round trip of said test signals between the first and second devices through the bidirectional interconnection and the interconnection establishing means.

36. The system of claim 35, wherein said measuring and determining means comprises means for measuring an average transmission delay of the round trip of said successive test signals between the first and second devices, and means for determining, from this average round trip transmission delay, an average value of the transmission delay of the first representative signal transmitted from the transmitting device to said other device through the communication interconnection.

37. The system of claim 36, wherein said compensating means comprises means for delaying the second representative signal for a period of time corresponding to said average value of the transmission delay of the first representative signal.

38. The system of claim 1, wherein said generating and bringing about means comprises, in said other of said first and second devices, means for generating successive test pulses constituting said at least one test signal and being transmitted from said other device to the transmitting device through the communication interconnection and the interconnection establishing means, and, in the transmitting device, means for reshaping the test pulses which are transmitted after reshaping thereof from the transmitting device to said other of said first and second devices through said communication interconnection and the interconnection establishing means, said measuring and determining means comprising, in said other of said first and second devices, means for measuring an average transmission delay of a round trip of said test pulses between said two devices, and for producing a signal representative to this average round trip transmission delay.

39. The method of claim 26, wherein said generating step comprises the step of generating a series of successive test signals each having a short duration and constituting said at least one test signal, and wherein said bringing about step comprises the step of bringing about successively a round trip of said successive test signals between the first and second devices through said bidirectional interconnection.

40. The method of claim 39, wherein said measuring step comprises the step of measuring an average transmission delay of the round trip of the successive test signals between the first and second devices, and wherein said determining step comprises the step of determining, from said average round trip tranmission delay, an average value of the transmission delay of the first representative signal transmitted from the transmitting device to said other device through the communication interconnection.

41. The method of claim 40, wherein said compensating step comprises the step of delaying the second representative signal for a time period corresponding to said average value of the transmission delay of the first representative signal.

42. The system of claim 38, wherein said compensating means comprises, in said other device, a delay compensator for delaying said second representative signal for a period of time equal to an average value of the transmission delay of said first representative signal, in response to a clock signal and in response to said signal representative of said average round trip transmission delay of said test pulses.

43. The system of claim 42, wherein the signal representative of the average round trip transmission delay of the test pulses is a pulse having a width representative of this average round trip transmission delay, the delay compensator comprising means for measuring half of said width in order to determine said average value of the transmission delay of said first representative signal from the transmitting device to the other device, and means for memorizing said average value of the transmission delay of said first representative signal.

44. The system of claim 43, in which said compensating means comprise means for modifying the width of said pulse representative of said average round trip transmission delay in order to compensate for a phase shift between the alternating voltage of the reference phase and the alternating voltage of the unknown phase produced by at least one transformer provided on said polyphase network between the point where the reference phase is located and the point where the unknown phase is located.

* * * * *